(12) United States Patent
El Rai et al.

(10) Patent No.: US 7,592,879 B2
(45) Date of Patent: Sep. 22, 2009

(54) INTEGRATED CIRCUIT WITH AT LEAST ONE INTEGRATED TRANSMISSION LINE

(75) Inventors: Samir El Rai, Duisburg (DE); Ralf Tempel, Duisburg (DE)

(73) Assignee: ATMEL Duisburg GmbH, Duisburg (DE)

( * ) Notice: Subject to any disclaimer, the term of this patent is extended or adjusted under 35 U.S.C. 154(b) by 185 days.

(21) Appl. No.: 11/526,814

(22) Filed: Sep. 26, 2006

(65) Prior Publication Data

US 2007/0145545 A1    Jun. 28, 2007

(30) Foreign Application Priority Data

Sep. 26, 2005    (DE) .................. 10 2005 046 009

(51) Int. Cl.
*H01P 5/00*    (2006.01)

(52) U.S. Cl. .................. 333/4; 333/246; 257/664

(58) Field of Classification Search .............. 333/4, 333/5, 12, 236, 246; 257/664; 174/36
See application file for complete search history.

(56) References Cited

U.S. PATENT DOCUMENTS

| | | | | |
|---|---|---|---|---|
| 5,357,050 A | * | 10/1994 | Baran et al. | 174/33 |
| 5,430,247 A | * | 7/1995 | Bockelman | 174/33 |
| 6,396,000 B1 | * | 5/2002 | Baum | 174/261 |
| 6,433,272 B1 | * | 8/2002 | Buhler et al. | 174/27 |
| 6,462,268 B1 | * | 10/2002 | Hazy et al. | 174/36 |
| 6,916,996 B2 | * | 7/2005 | Kuan et al. | 174/262 |
| 7,280,808 B2 | * | 10/2007 | Murray et al. | 455/114.2 |
| 2005/0253662 A1 | * | 11/2005 | Seefried | 333/1 |

FOREIGN PATENT DOCUMENTS

DE    101 57 678 A1    6/2003
DE    103 48 722 A1    5/2005

* cited by examiner

*Primary Examiner*—Rexford N Barnie
*Assistant Examiner*—Crystal L Hammond
(74) *Attorney, Agent, or Firm*—Muncy, Geissler, Olds & Lowe, PLLC

(57) ABSTRACT

An integrated circuit is disclosed that includes at least one integrated transmission line for the transmission of a high-frequency differential signal with a number of at least two series-connected line arrangements, each of which has a differential input, a differential output, a first trace, connected to a first terminal of the differential input and a first terminal of the differential output, and a second trace, connected to a second terminal of the differential input and a second terminal of the differential output. According to the invention, each line arrangement has at least two crossing areas, in which the first and the second traces cross, and at least four positive feedback regions, in which at least one first section of the first trace is placed at a small first distance to at least one second section of the second trace in such a way that the magnetic fields, caused by the currents flowing in the first and section sections, are mutually amplified in the exterior space surrounding the first and second sections when the high-frequency differential signal is applied at the differential input of the line arrangement.

22 Claims, 4 Drawing Sheets

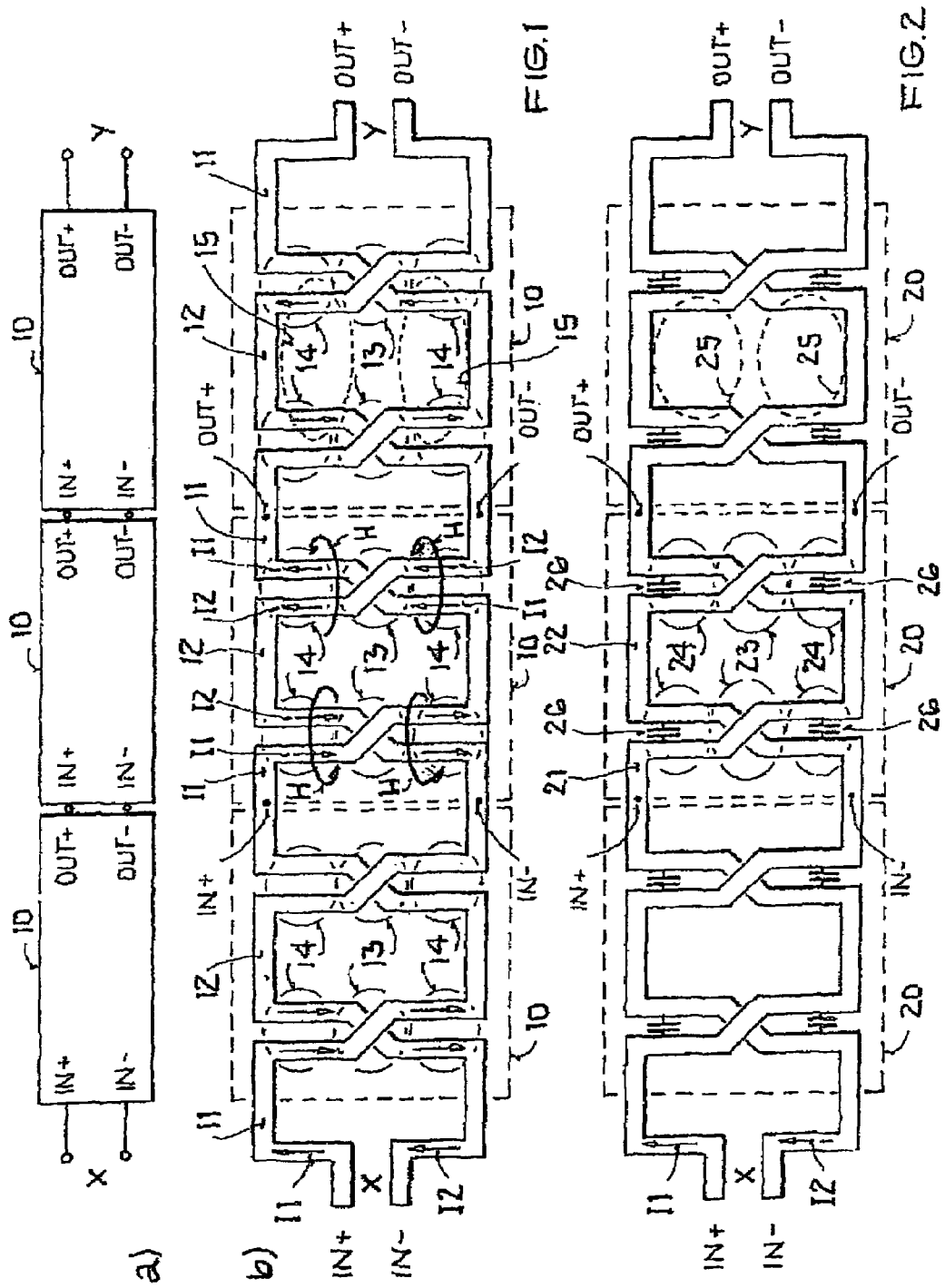

INTEGRATED CIRCUIT WITH AT LEAST ONE INTEGRATED TRANSMISSION LINE

This nonprovisional application claims priority under 35 U.S.C. § 119(a) on German Patent Application No. DE 102005046009, which was filed in Germany on Sep. 26, 2005, and which is herein incorporated by reference.

BACKGROUND OF THE INVENTION

1. Field of the Invention

The present invention relates to an integrated circuit with at least one integrated transmission line. The invention further relates to the field of integrated semiconductor circuits (integrated circuit, IC), within the field of transmission lines, integrated into such circuits, for the transmission of high-frequency electrical signals.

2. Description of the Background Art

For the transmission of high-frequency differential signals, symmetrically constructed transmission lines are typically used, which have two straight line branches arranged at a certain distance to one another. The electrical length of such a classic transmission line, which is proportional to the phase shift of the signal to be transmitted, is within the magnitude of the signal wavelength. At a frequency of, e.g., 30 GHz, the free space wavelength is 10 mm, whereas, e.g., at 3 GHz a wavelength of 100 mm results.

The properties, such as, e.g., wave impedance (impedance), propagation constant, or quality (Q-factor), etc., of a classic transmission line can be changed by varying the cross section of the line branches, their distance to one another, their distance to ground, and/or the dielectric constant of the surrounding medium. The geometric length of a classic transmission line, i.e., its dimensions in the signal propagation direction, can be changed by such measures but not critically.

If a transmission line is to be integrated on a semiconductor chip (IC), only a very small area is available for this, whose dimensions are considerably smaller than the geometric lengths, achievable by the aforementioned measures, of classic transmission lines.

To be able to realize longer transmission lengths in an area with predefined dimensions, the lines are typically made meander-shaped, as shown schematically in FIG. 7. It is a disadvantage here that in comparison with a conventional transmission line at the same geometric length of the extended line branches, due to the meander shape, the quality of the transmission line declines and thereby its insertion loss increases. In addition, the geometric line length per unit area can be at best doubled by this approach. Because of the too low values of the electrical length or the phase shift, it is not possible to integrate meander-shaped transmission lines for the transmission of signals in the frequency domain of considerably less than 30 GHz into an IC.

SUMMARY OF THE INVENTION

It is therefore an object of the present invention to provide an integrated circuit with at least one integrated transmission line, which can be implemented simply and cost effectively and which has a high quality and/or low insertion loss and a long electrical length and/or phase shift and enables long geometric line lengths per unit area, so that signals within the frequency domain well below 30 GHz, e.g., between about 2 GHz and 20 GHz, can also be transmitted in an integrated circuit.

The integrated circuit, according to an embodiment of the invention, includes at least one integrated transmission line for the transmission of a high-frequency differential signal and has a number of at least two series-connected line arrangements, each of which has a differential input, a differential output, a first trace connected to a first terminal of the differential input and a first terminal of the differential output, and a second trace connected to a second terminal of the differential input and a second terminal of the differential output, whereby each line arrangement has at least two crossing regions, in which the first and the second traces cross, and at least four positive feedback regions, in which at least one first section of the first trace is placed at a small first distance to at least one second section of the second trace in such a way that the magnetic fields, caused by the currents flowing in the first and second sections, are mutually amplified in the exterior space surrounding the first and second sections when the high-frequency differential signal is applied at the differential input of the line arrangement.

At least two series-connected line arrangements each with two traces are provided, which are designed so that the magnetic amplification effects are kept large in the (radial) exterior space surrounding the two traces and the magnetic losses or the current displacement are kept low in the interior space between the two traces. This is achieved in that the first and second trace sections are arranged at a small first distance to one another in such a way that currents flow through them codirectionally, when the high-frequency differential signal is applied at the differential input of the line arrangement. In these "positive feedback regions" of the line arrangement, as a result the magnetic fields are amplified in the exterior space surrounding the first and second trace sections. The magnetic coupling between the traces increases thereby, so that the quality of the transmission line increases or its insertion loss declines and the electrical length or phase shift increases. Because it includes at least two series-connected line arrangements, the transmission line has homogeneous transmission properties. Furthermore, it is simple and cost-effective to implement.

In an embodiment, the at least one first section and the at least one second section run substantially parallel to one another. As a result, the magnetic coupling and thereby the phase shift and the quality of the transmission line increase.

According to another embodiment, the line arrangements can be substantially identical to one another. As a result, e.g., the wave impedance (impedance) and the quality (Q-factor) of the transmission line are identical to the wave impedance or the quality of each individual line arrangement. The electrical length and phase shift of the entire transmission line are obtained by multiplying the electrical length or the phase shift of an individual line arrangement by the number of line arrangements present. As the properties of the transmission line can be derived in a simple manner from the properties of each individual line arrangement, the transmission line can be developed simply and cost-effectively, and because of the substantially identical repetition of the line arrangements it can be implemented simply.

In an embodiment, each line arrangement can be designed in such a way that the first and second sections together have a total length corresponding to a large proportion of the total length of the first and the second trace of this line arrangement. Preferably, this proportion constitutes at least a third. As overall a high portion of the trace sections is within the positive feedback regions, the magnetic coupling between the traces and thereby the electrical length and the quality increase further, whereas the insertion loss declines further.

In another embodiment, the first distance can have a value corresponding to 50% to 200%, preferably 100% of the width of the first trace.

In another embodiment, overall at least two capacitive elements can be placed (connected) in the positive feedback regions of each line arrangement between the first trace and the second trace. As a result, the distributed capacitance of the transmission line is increased advantageously, so that the attenuation of the transmission line declines further and the electrical length or phase shift increases further.

The at least two capacitive elements can have at least one capacitor, preferably at least one high-quality MIM capacitor (metal insulator metal).

The at least two capacitive elements can have at least one element of variable capacitance, preferably a varactor or a capacitive digital-to-analog converter (CDAC). By this means, the properties of the transmission line can be changed or set after its manufacture by an electrical control signal.

In another embodiment, overall at least two amplification elements can be placed in the positive feedback regions of each line arrangement between the first trace and the second trace. Advantageously, these are unipolar or bipolar transistors. As a result, an active transmission line is obtained, which functions advantageously as a distributed amplifier.

According to another embodiment, each line arrangement can be designed in such a way that overall a large proportion, preferably at least ⅓, of the area occupied overall by the line arrangement is occupied by the first or second trace. As a result, the available chip area is utilized efficiently. Per unit area, greater geometric lengths (dimensions) of the extended traces and thereby also longer electrical lengths per unit area and higher qualities are achieved, so that signals within the frequency domain of well below 30 GHz can also be transmitted.

According to another embodiment, each line arrangement can be designed in such a way that the first trace and the second trace each form at least two loops and the loops of the first trace lie partially within the loops of the second trace and surround these in part. As a result, the available chip area is utilized efficiently. The magnetic coupling increases further advantageously.

In another embodiment, each line arrangement can be designed in such a way that the currents, flowing in directly adjacent trace sections, when the high-frequency differential signal is applied at the differential input of the line arrangement, do not mutually displace each other substantially in any of the directly adjacent trace sections. As a result, magnetic losses and thereby insertion loss are reduced. The term "directly adjacent" is to be understood here that no other (additional) trace section is placed between the third and fourth section.

In another embodiment, each line arrangement can have negative feedback regions, in each of which a third section of the first or second trace is placed at a greater second distance to a directly adjacent fourth section of the first or second trace in such a way that in the interior space between the third and fourth sections, the magnetic fields caused by the currents flowing through the third and fourth sections, when the high-frequency differential signal is applied at the differential input of the line arrangement, are mutually only insignificantly displaced, whereby the second distance is greater than the first distance. As a result, magnetic losses and thereby the insertion loss are further reduced.

The third and fourth sections can be parallel to one another, so that the magnetic losses decline.

Each line arrangement can be designed in such a way that the third and fourth sections together have a shorter total length than the first and second sections together.

In another embodiment, the second distance can have a value corresponding to twice to six times, preferably three to five times, the value of the width of the first trace.

In another embodiment, the first traces and the second traces can each be designed substantially symmetric to a point that lies in one of the crossing regions. This type of transmission line is simple to develop and realize.

In an alternative embodiment, the first traces and the second traces can each be designed substantially symmetric to a level that is perpendicular to the propagation direction of the high-frequency differential signal. This type of transmission line is also simple to develop and realize.

According to an embodiment, the integrated circuit of the invention can have at least two metallization levels. In this way, the crossing regions can be simply implemented.

In another embodiment, the at least one first section and the at least one second section run at an angle of a maximum 45 degrees to one another. Preferably, the angle is a maximum of 30 degrees. As a result, the magnetic coupling and thereby the phase shift and the quality of the transmission line increase especially greatly.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 1*a-b* illustrate a first embodiment of the invention (top view);

FIG. 2 illustrates a second embodiment of the invention with additional capacitive elements (top view);

DETAILED DESCRIPTION

Figure 3:
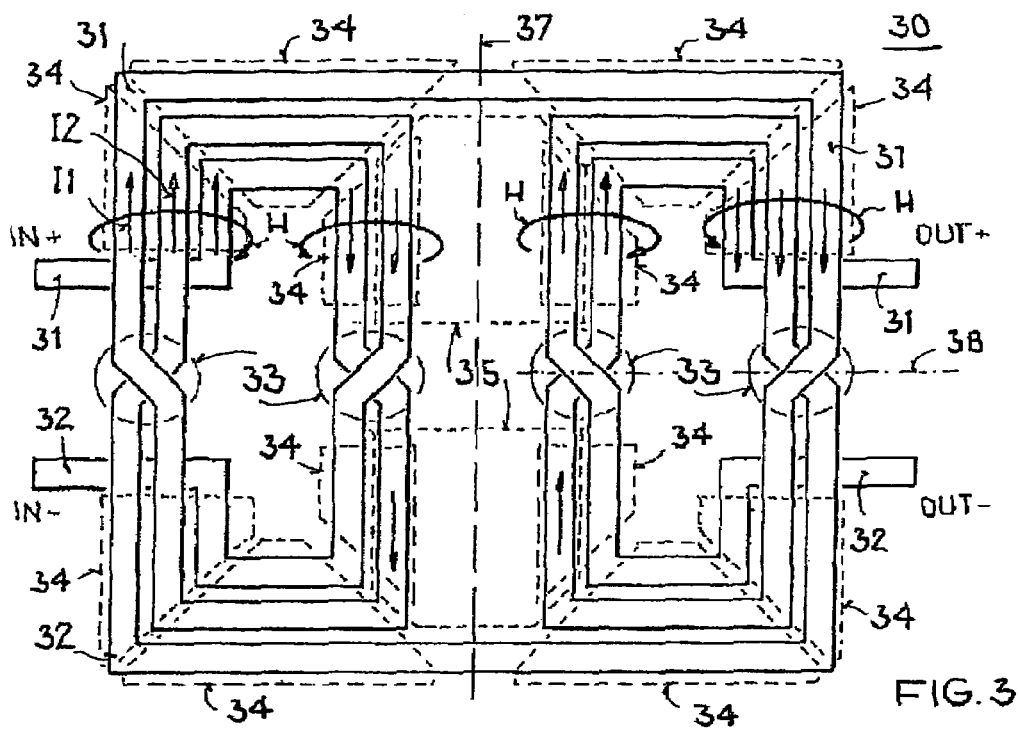
FIG. 3 illustrates a line arrangement for a third embodiment with a high line length/area ratio (top view)

In the figures, the same and functionally identical elements and signals, if not specified otherwise, are provided with the same reference characters.

FIG. 1 shows in part a) a block diagram and in part b) a top view of an integratable transmission line for transmitting a high-frequency differential signal x. The top view according to FIG. 1 corresponds to an excerpt of a horizontal cutting plane through a first embodiment of an integrated circuit of the invention.

The integratable transmission line shown in FIG. 1 comprises overall N=3 line arrangements 10 connected in series. Each line arrangement 10 hereby has a differential input IN with a first terminal IN+ and a second terminal IN− and a differential output OUT with a first terminal OUT+ and a second terminal OUT−. The high-frequency differential signal x hereby is applied at differential input IN of line arrangement 10 shown on the left in FIG. 1 (input-side), whereas the output signal y can be tapped at differential output OUT of line arrangement 10 shown on the right in FIG. 1 (output-side).

As is evident from FIG. 1*b*, each line arrangement 10 has a first trace 11 connected to its input terminal IN+ and its output terminal OUT+ and a second trace 12 connected to its input terminal IN− and its output terminal OUT−. The trace routing and design of the first and second traces are hereby substantially identical in all line arrangements 10, so that the N=3 line arrangements are made substantially identically. If, e.g., traces 11 are presented in an extended straight-line form, thus it is understood that the geometric length (path length) L of the thus extended traces 11 exceeds the greatest dimension of the transmission line, i.e., the horizontal expansion of the three line arrangements 10 in the signal propagation direction. Because of the symmetric layout of the traces, this also applies to traces 12.

Each of the line arrangements 10, shown in FIG. 1*b*, have two crossing regions 13, in which first trace 11 and second trace 12 cross. The crossing angle in this case is between 45 and 135 degrees, preferably about 90 degrees (e.g., 70-110 degrees). To separate traces 11, 12 galvanically from one another in crossing regions 13, in these regions in each case one of traces 11 or 12 is routed in a lower and the other (12 or 11) in an upper metallization level of the integrated circuit, between which there is an insulator, e.g., of silicon dioxide, polyimide, etc. Through-hole platings (not shown in FIG. 1*b*) galvanically connect the trace section in the lower metallization level (shown with broken path limiting lines) at its path ends with the corresponding trace in the upper metallization level.

If the high-frequency differential signal x is applied at the differential input of the transmission line, i.e., at the differential input IN of the input-side line arrangement 10, then the currents I1 or I2 flow through first traces 11 and second traces 12, respectively. The directions of currents I1 and I2 are shown in FIG. 1*b* by way of example by arrows within the traces for a specific time, in which current I1 flows from input terminal IN+ of the input-side line arrangement 10 through the first traces 11 to the output terminal OUT+ of the output-side line arrangement 10 and current I2 due to the differential nature of the signal x flows from the output terminal OUT− of the output-side line arrangement 10 through the second traces 12 to input terminal IN− of the input-side line arrangement 10. At other times, the reverse relations, of course, occur if applicable.

Currents I1 and I2 in each case produce a magnetic field around the first or second traces 11, 12. In regions in which the sections of the traces run parallel to each other at a small distance, the magnetic fields mutually amplify in the exterior space surrounding the trace sections (whereas they weaken in the interior space between the two traces), provided the currents I1, I2 flow in the same direction, i.e., codirectionally. The smaller the distance of the trace sections here, the more pronounced this magnetic amplification effect in the exterior space around the traces.

If currents I1 and I2 flow through directly neighboring trace sections in the opposite direction, however, i.e., antiparallel, the magnetic fields in the exterior space become weaker and attempt to displace themselves in the interior space. This displacement per se leads to magnetic losses, but also to a displacement of the current flow in each opposite trace section. The greater the distance between these trace sections here, the weaker this displacement effect and the magnetic losses. This effect occurs finally also in sections with current flowing in the reverse direction in the same trace.

According to the invention, the line arrangements are designed in such a way that the magnetic amplification effects in the exterior space surrounding the two traces are kept great and the magnetic losses in the interior space kept small.

For this purpose, trace sections, through which currents I1, I2 flow in the same direction, are placed at a small distance to one another, so that the magnetic fields in these "positive feedback regions" of the line arrangement are substantially amplified in the exterior space surrounding both traces. Preferably, the distance between the adjacent edges of the coupling trace sections have a value of about 50% to a maximum of 200% of the specific trace width. Typically, this distance corresponds approximately to a complete trace width (100%).

As shown in FIG. 1*b*, each line arrangement 10 of the first embodiment has four positive feedback regions 14, in which first trace 11 is placed at a small distance (which corresponds approximately to a full trace width) parallel to second trace 12 in such a way that in the exterior space surrounding the traces, the magnetic fields mutually amplify each other due to the codirectional current flow. The field lines designated by the letter H of the resulting amplified magnetic field are drawn in the four positive feedback regions 14 of line arrangement 10 shown in the middle in FIG. 1*b*.

The interior spaces lying in positive feedback regions 14 between traces 11, 12, in contrast, are magnetically virtually field-free. These virtually field-free spaces are utilized advantageously in the second embodiment explained in greater detail below with reference to FIG. 2.

Reverse (antiparallel) current-carrying trace sections, in contrast, are placed at a relatively large distance to one another. A relatively large distance here is taken to mean a distance that is greater than the aforementioned distances between coupling trace sections. Preferably, such a relatively large distance is double to six times, typically three to five times the value of the trace width. In such "negative feedback regions," the magnetic fields are only insignificantly displaced in the interior space between the contradirectional current-carrying trace sections because of the relatively large distance of the trace sections; i.e., only minor magnetic losses arise. In FIG. 1*b*, two negative feedback regions 15 are indicated by way of example in the output-side line arrangement 10. The horizontal distance of the trace sections, carrying current from top to bottom, to the neighboring sections, carrying current from bottom to top, in this example is approximately five times the trace width.

Line arrangement 10 is thus designed in such a way that overall a large portion of the total trace length present in the line arrangement falls within positive feedback region 14. According to FIG. 1*b*, this portion is about 30%. Furthermore, it is evident from FIG. 1*b* that the entire path length of the trace sections falling within negative feedback regions 15 per line arrangement 10 is less than that of trace sections falling within positive feedback region 14.

It is evident furthermore from FIG. 1*b* that first traces 11 but also second traces 12 are designed substantially point-symmetric to the points that lie in the middle of crossing region 13.

Instead of precisely N=3 line arrangements according to FIG. 1, other values of N can also be selected, e.g., N=20. However, at least two line arrangements 10 are to be provided.

Whereas, e.g., the three line arrangements 10, shown in FIG. 1, have been identically designed, for example, to simplify the connection of the transmission line to other circuit elements of the same integrated circuit (IC), it can be advantageous to design the traces in the input region of the first (input-side, "left") line arrangement and/or in the output region of the last (output-side, "right") line arrangement differently from the traces of the "middle" line arrangement(s), so that the line arrangements in fact differ slightly from one another, but are substantially still identical to one another. This fact will be explained in greater detail below with reference to FIG. 5.

Because of the substantially identical design of the line arrangements, the individual line arrangements have essentially identical properties such as wave impedance (impedance), quality (Q-factor), phase rotation, or electrical length. The integratable transmission line of N line arrangements connected in series also has the wave impedance and the quality of a single line arrangement, but the N-fold phase rotation or electrical length. The number N of required line arrangements, accordingly, can be determined in a simple way from the total desired phase rotation and the phase rotation of a single line arrangement. These associations between the properties of a single line arrangement and those of the entire transmission line of N line arrangements apply in substantially identically designed line arrangements also for the embodiments described below.

The input-side and/or output-side line arrangement finally, e.g., to adapt the wave impedance to the circuit arrangement connected at the input side or output side, can be designed in each case different from the middle line arrangement(s).

The aforementioned magnetic amplification effects also occur when trace sections are not arranged precisely parallel but substantially parallel in the positive feedback regions or the currents in these trace sections flow substantially codirectionally. "Substantially" here means is that the angle of aperture between the currents or the directional trace sections, which in the case of parallel (and codirectional) currents is zero degrees, preferably has a maximum value of 45 degrees. Preferably, this angle has a maximum value of 30 degrees. This also applies to the negative feedback regions, in which the angle of aperture, which is 180 degrees in the case of antiparallel currents, has a minimal value of 135 degrees. Preferably this angle is at least 150 degrees. This fact as well also applies to the embodiments described below.

FIG. 2 shows a top view of a second embodiment with an integratable transmission line, which also comprises N=3 line arrangements 20 connected in series. Because first and second traces 21, 22 are arranged and designed identically to traces 11 or 12 of the first embodiment, crossing regions 23, positive feedback regions 24, and negative feedback regions 25, which coincide with FIG. 1, result in FIG. 2. To simplify the presentation, the individual reference symbols in FIG. 2 are only provided in part.

As explained with reference to FIG. 1, the spaces in positive feedback regions 24 between traces 21, 22 are magnetically virtually field-free. These magnetic virtually field-free spaces can be utilized advantageously for accommodating additional integrated components.

The second embodiment differs from the first embodiment according to FIG. 1 in that in each positive feedback region 24 a capacitive element 26 is connected between first trace 21 and second trace 22, so that per line arrangement 20 a total of four capacitive elements 26 are provided. Alternatively, several parallel-connected capacitive elements can be provided per positive feedback region or at least one capacitive element each can be provided in only two (e.g., positive feedback regions 24 shown on the left in FIG. 2) of the four positive feedback regions.

As a result of the insertion of capacitive elements 26, the distributed capacitance of the transmission line is increased, so that the attenuation of the transmission line declines further and the electrical length or phase shift increases further. In addition, as a result, the quality of the transmission line increases with declining wave impedance (impedance).

Capacitive elements 26 can be capacitors, e.g., MIM capacitors (metal insulator metal) of high quality, diodes, etc., or capacitive components of variable capacitance, such as, e.g., varactors or CDACs (capacitive digital-to-analog converters), with whose help the properties of the transmission line, such as wave impedance (impedance) and electrical length or phase shift, can be set after their manufacture by means of an electrical control signal.

Instead of or in addition to capacitive elements 26, overall at least two amplification elements can be placed in positive feedback regions 24 of each line arrangement 20 between first trace 21 and second trace 22. As a result, an active transmission line is obtained, which functions advantageously as a distributed amplifier. The amplification elements can be advantageously bipolar or unipolar transistors, whereby at least one transistor is connected at its base or gate terminal to first trace 21 and at its collector or drain terminal to second trace 22 and at least one other transistor is connected at its base or gate terminal to second trace 22 and at its collector or drain terminal to first trace 21. The emitter or source terminals are hereby each connected to ground.

Figure 4:
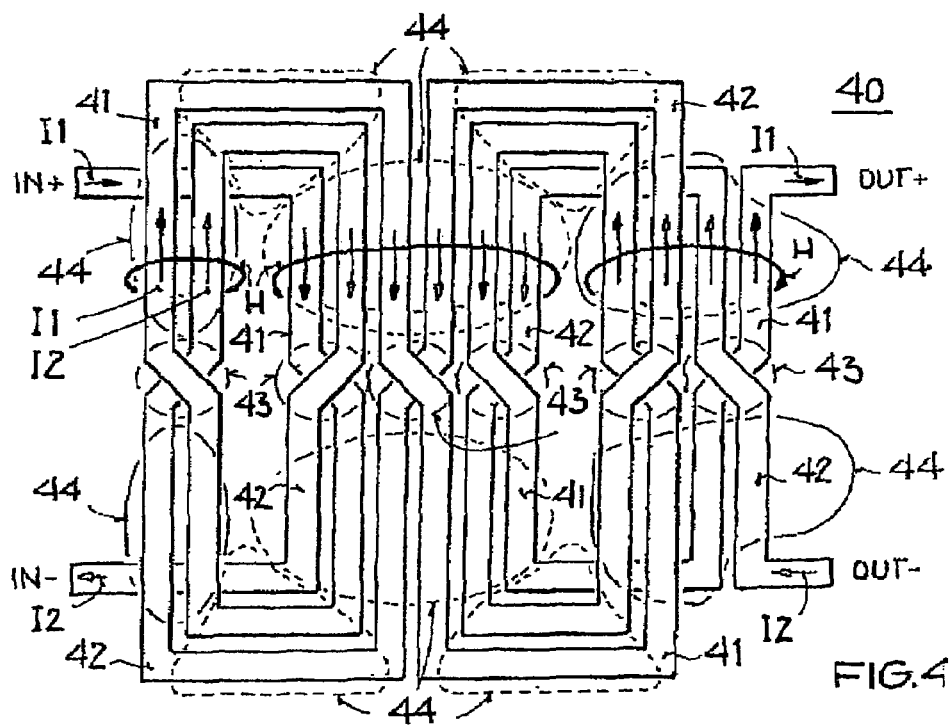
FIG. 4 illustrates a line arrangement for a fourth embodiment with a high line length/area ratio and optimized properties (top view)

FIGS. 3 and 4 show top views of line arrangements 30 or 40 for a third or fourth embodiment, respectively. These embodiments result from the N-fold (at least twofold) series connection of the shown line arrangement 30 or 40, whereby the fourth embodiment is shown for the case N=4 in FIG. 5.

In the third and fourth embodiment, (if possible) long traces are to be realized on a chip area of a given size available overall for the transmission line. A high trace length/area ratio is therefore necessary in each line arrangement 30 or 40.

This is achieved in that—with consideration of the principles and objectives discussed in regard to FIG. 1—a large portion of the area occupied by line arrangement 30 or 40 is occupied by traces 31, 32 or 41, 42, in that each trace is designed as a loop in such a way that it has at least two loops per line arrangement, whereby the loops of the one trace (e.g., the first trace 31 or 41) run in part within a loop of the other trace (e.g., second trace 32 or 42) and in part surround a loop of the other trace (e.g., 32 or 42). Line arrangement 30 or 40 is hereby designed in such a way that currents I1 and I2 flow in the same direction through adjacent trace sections of these trace loops lying in one another.

According to FIG. 3, first trace 31 is designed in such a way that proceeding from input terminal IN+ in the left half of line arrangement 30, it forms a first loop clockwise, then is routed at the top in the figure in the right half of line arrangement 30 and there forms a second loop clockwise, which is connected to the output terminal OUT+. Second trace 32 is designed in such a way that proceeding from output terminal OUT− in the right half of line arrangement 30, it forms a third loop clockwise, then is routed downward in the figure in the left half, and there forms a fourth loop clockwise, which is connected to the input terminal IN−. It is achieved with the use of a total of four crossing regions 33 that the first loop hereby lies partially within and partially outside the fourth loop and the second loop is placed partially within and partially outside the third loop.

At each point in time, currents I1, I2 flow codirectionally through adjacent trace sections located within the loop regions, i.e., in a uniform direction. In the case of the drawn current directions, for example, all four loops carry current in the clockwise direction. Overall, 12 positive feedback regions 34 can be identified, in which due to the trace sections carrying current codirectionally, the magnetic fields in the exterior space around these trace sections are mutually amplified.

The two traces 31, 32 are each designed substantially symmetric to a level that is perpendicular to the direction of propagation of the differential signal x (from left to right in FIG. 3) and is shown in FIG. 3 by its intersection line 37 with the plane of the drawing.

To the right and left of intersection line 37, line arrangement 30 has contradirectional (antiparallel) current-carrying trace sections parallel to this line 37. In these negative feedback regions 35 magnetic losses arise, which can be substantially avoided, as shown in FIG. 3, e.g., by a relatively large horizontal distance of the trace sections. The magnetic fields, which are caused by the specific currents, become weaker in the exterior spaces and are then only insignificantly displaced in the interior spaces of these trace sections. The trace sections falling within negative feedback regions 35 are therefore arranged at a large distance to one another in such a way that in the interior space between the trace sections the magnetic fields, caused by the currents flowing in the trace sections, are only insignificantly mutually displaced when the high-frequency differential signal x is applied at the differential input IN of the line arrangement.

With respect to the distances between directly adjacent trace sections in the positive feedback or negative feedback regions, reference is made to the aforementioned relative statements in regard to FIG. 1. According to FIG. 3, the distances in positive feedback regions 34 correspond approximately to half a trace width, and those in negative feedback regions 35 approximately to five times a trace width.

According to FIG. 3, a high proportion, namely, about 70-80%, of the total trace length is routed in positive feedback regions 34. Furthermore, it is evident from FIG. 3 that the entire path length of the trace sections falling within negative feedback regions 35 per line arrangement 30 is clearly less than that of trace sections falling within positive feedback region 34.

Through the loop-shaped design of traces 31, 32, a large proportion, in the case of FIG. 3 about ⅓, of the area occupied overall by line arrangement 30, is occupied by the first or second trace, so that a high trace length/area ratio advantageously results.

Analogous to the second embodiment according to FIG. 2, in the third embodiment in positive feedback regions 34 of each line arrangement 30, at least two capacitive elements and/or at least two amplification elements (at least one in the top half and at least one in the bottom half) can also be connected between the first and second trace. Thus, for example, in each case one capacitor, a varactor, and/or transistor are provided in the left and/or right half of the line arrangement between the topmost horizontal trace section in FIG. 3 and the horizontal section drawn below it and between the lowest horizontal section and the horizontal section drawn above it.

Instead of only one loop per half of the line arrangement, each trace can also form several loops per half of the line arrangement. As a result, on a given area, still larger trace lengths can be integrated; nevertheless, the number of required metallization levels increases accordingly thereby.

Furthermore, instead of the square form according to FIG. 3, the loops can also be made with "rounded corners," octahedral, oval, or round.

Reference is made to the aforementioned explanations for FIG. 1 on the parallel or substantially parallel course of trace sections.

FIG. 4 shows a top view of a line arrangement 40 for a fourth embodiment, in which a very high trace length/area ratio is to be achieved with low magnetic losses.

This is achieved in that the right half of line arrangement 30 of FIG. 3 is rotated 180 degrees around the axis 38 of the transmission line, as drawn in FIG. 3, but the connection points to the left half and the output terminals OUT+, OUT– are retained in their position. As a result, two additional crossing regions 43 form in the middle of line arrangement 40 and near output terminals OUT+ and OUT–.

According to FIG. 4, first trace 41 is designed in such a way that proceeding from input terminal IN+ in the left half of line arrangement 40, it forms a first loop clockwise, then is routed in the figure from above via the additional middle crossing region 43 downward into the right half and there forms a second loop counterclockwise, which is connected to the output terminal OUT+ via the additional output-side crossing region 43. Second trace 42 is designed in such a way that proceeding from output terminal OUT– after running through the output-side crossing region 43 in the right half of line arrangement 40, it forms a third loop counterclockwise, then is routed in the figure from above via the additional middle crossing region 43 downward into the left half, and there forms a fourth loop clockwise, which is connected to the input terminal IN–. Analogous to FIG. 3, it is achieved hereby with the use of four crossing regions 43 that the first loop lies partially within and partially outside the fourth loop and the second loop is placed partially within and partially outside the third loop.

At each point in time, the currents I1, I2 flow codirectionally, i.e., in the same direction, through adjacent trace sections located within the loop regions. In the case of the current directions labeled by the drawn arrows, for example, current flows through the first and fourth loop in the left half of line arrangement 40 in the clockwise direction and through the second and third loop in the right half in the counterclockwise direction. As a result of the rotation directions different at all times (clockwise or counterclockwise) in the left or right half of line arrangement 40, the currents now flow codirectionally also at the separation line of both halves.

Overall, 10 positive feedback regions 44 can be identified, in which due to the codirectionally current-carrying trace sections, the magnetic fields in the exterior space around these trace sections are mutually amplified. The two large central positive feedback regions 44, which now each comprise six codirectionally current-carrying parallel trace sections, replace the four smaller central positive feedback regions 34 (of two trace sections each) and the two negative feedback regions 35 of FIG. 3. In an input-side and/or output-side continuation of line arrangement 40 by other line arrangements 40 as well, the input-side or output-side positive feedback regions 44 increase from two or four to six parallel trace sections; negative feedback regions do not arise hereby. The trace sections formed in addition by the 180-degree rotation of the right half of line arrangement 30 of FIG. 3 therefore almost totally fall within positive feedback or crossing regions; the central negative feedback regions 35 of FIG. 3 and the negative feedback regions between identical line arrangements 30, on the contrary, do not occur in FIG. 4.

In this way, a very high proportion, namely, about 80-90%, of the total trace is routed through positive feedback regions 44. In addition, a large proportion, in the case of FIG. 4 about 40-50%, of the overall area occupied by line arrangement 40 is occupied by the first or second trace 41, 42, so that a very high trace length/area ratio advantageously results.

With respect to the advantageous distances between directly adjacent trace sections in the positive feedback regions, reference is made to the aforementioned relevant statements in regard to FIG. 1. According to FIG. 4, the distances in positive feedback regions 44 correspond approximately to half a trace width.

Analogous to the second and third embodiment, also in the fourth embodiment in positive feedback regions 44 of each line arrangement 40 at least two capacitive elements and/or at least two amplification elements (at least one in the top half and at least one in the bottom half) can also be connected between the first and the second trace. In comparison with the third embodiment, such elements can now be provided also on the separation line between the right and left half of line arrangement 40 or at the contact lines of two series-connected line arrangements 40 (each in positive feedback regions).

Analogous to the third embodiment, in the fourth embodiment as well, several loops can also be provided per half of the line arrangement and the loop can be made square, rounded off, round, etc.

Figure 5:
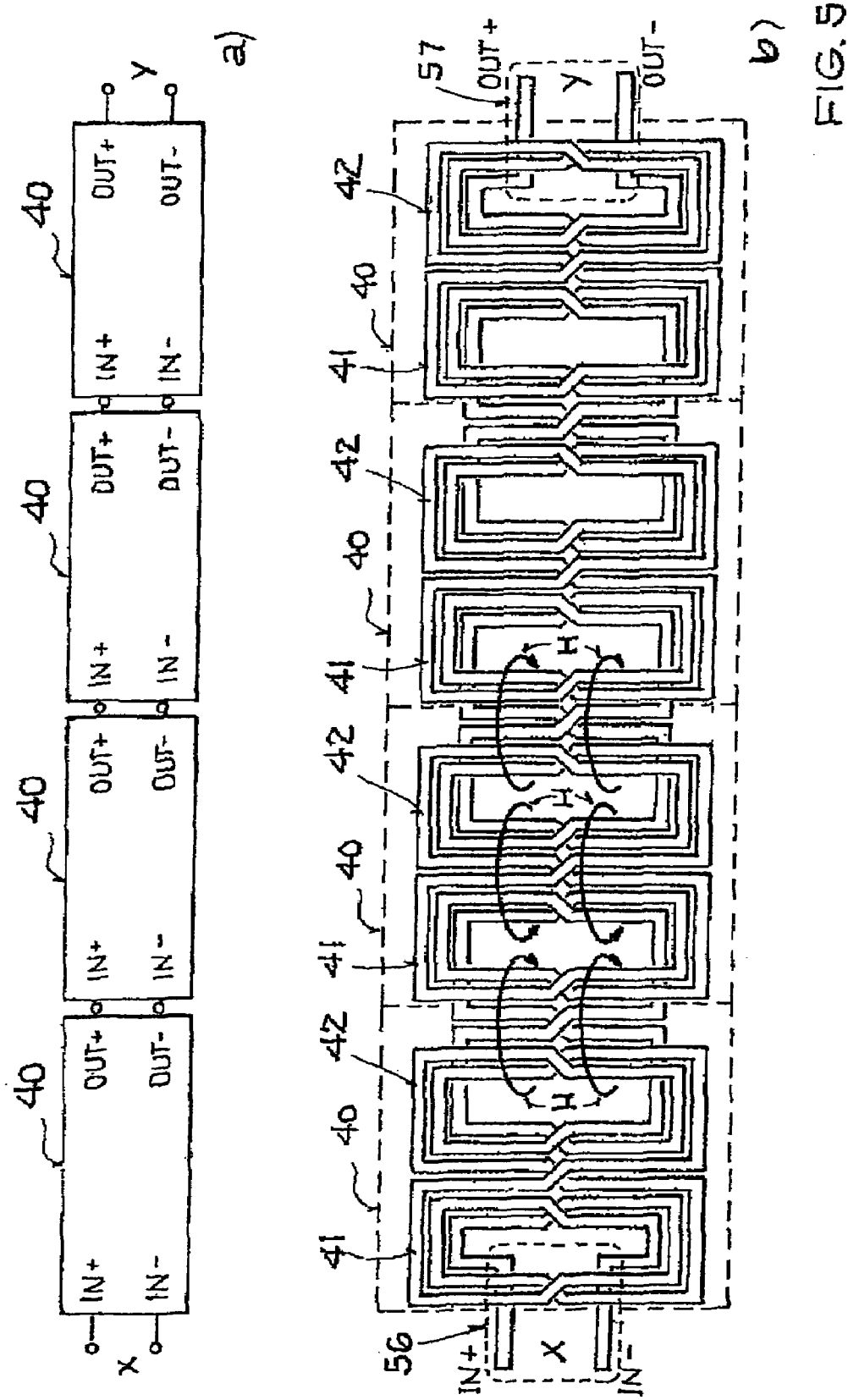
FIGS. 5*a-b* illustrate a fourth embodiment of the invention with the line arrangement of FIG. 4 (top view)

FIG. 5 in part a) shows a block diagram and in part b) a top view of the fourth embodiment with an integratable transmission line, which comprises N=4 series-connected line arrangements 40 according to FIG. 4. Hereby, the two middle line arrangements correspond to the drawing according to FIG. 4, whereas the trace routing in input region 56 of the input-side line arrangement and in output region 57 of the output-side line arrangement was slightly modified, in order to be able to connect, e.g., the transmission line more simply to other circuit units of the same integrated circuit (IC).

It can be seen from the field lines (H), drawn as examples, that all positive feedback regions, which connect directly above and below the crossing regions, now have six codirectionally current-carrying trace sections, whose magnetic fields amplify substantially in the exterior space around these sections. The fourth embodiment thus makes it possible with very small magnetic losses to integrate very long traces on a small area.

It is evident from FIG. 5 that first traces 41, but also second traces 42 are substantially point-symmetric to points that are located in the middle of the central regions of three successive crossing regions 43. Slight deviations from this symmetry result in particular in input region 56 and in output region 57.

Instead of precisely N=4 line arrangements according to FIG. 5, other values of N can also be selected. However, at least two line arrangements are to be provided.

In all line arrangements 40 of FIG. 5, the output-side crossing region and the vertical trace sections directly adjacent thereto can be omitted. For odd values of N, this has a result that the output terminal OUT+ in contrast to FIG. 5 is placed on the bottom right and the output terminal OUT− on the top right, whereas with even values of N relations that are the same compared with FIG. 5 result.

Figure 6:
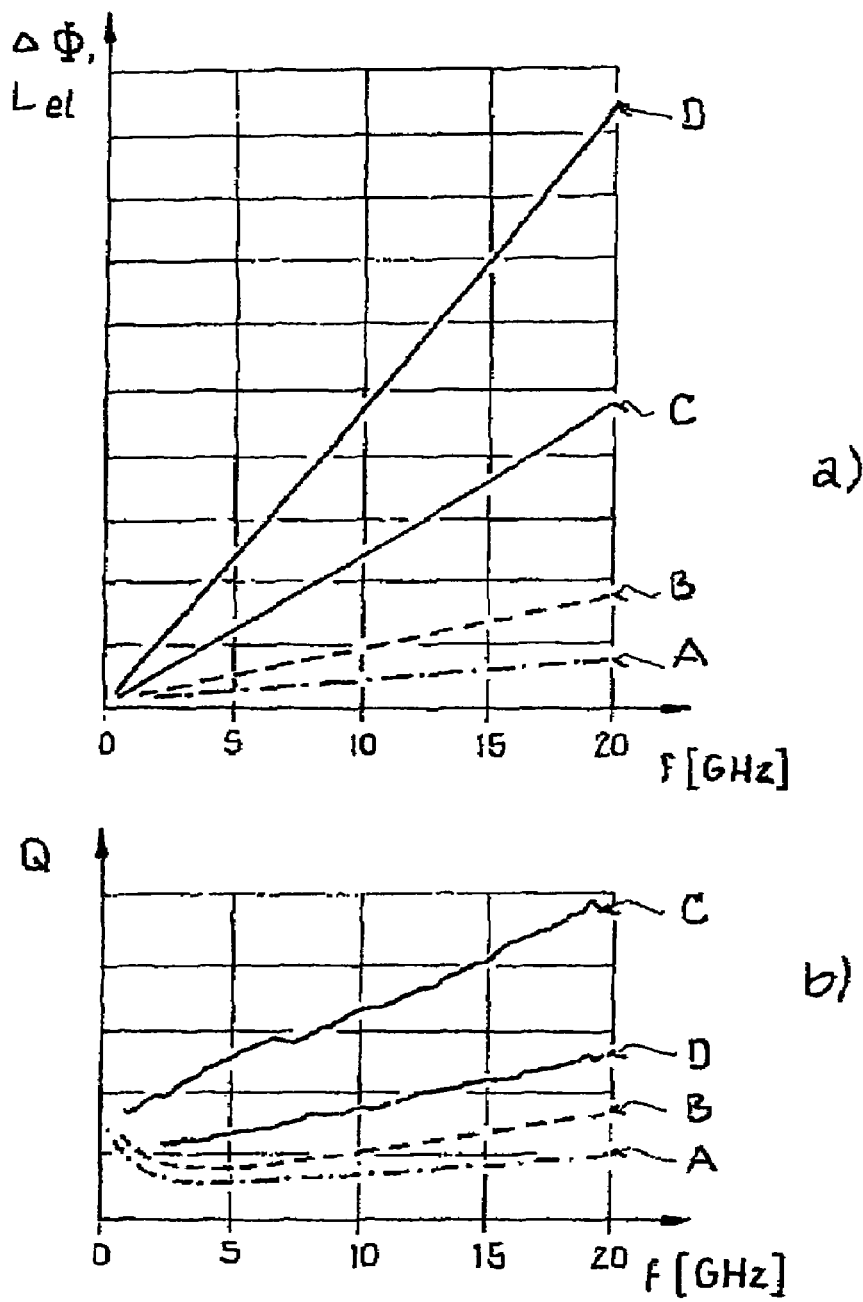
FIGS. 6*a-b* illustrates conduction properties of different embodiments.
Figure 7:
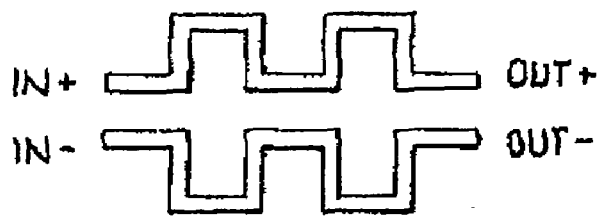
FIG. 7 illustrates a conventional a meander-shaped transmission line.

FIG. 6 shows schematically different conduction properties of the first, second, and fourth embodiments. The properties of a meander-shaped conduction are also shown for comparison. In all cases, the area utilized for the specific transmission line has the same size. The curves designated by A-D refer as follows to the individual transmission lines:

A: meander-shaped transmission line according to FIG. 7 (continued identically), B: first embodiment according to FIG. 1, C: second embodiment according to FIG. 2 with MIM capacitors, and D: a fourth embodiment according to FIG. 5, but with N=3.

The phase shift $\Delta\phi$ of the signal x caused by the specific transmission line or the electrical length $L_{el}$, proportional hereto, of the specific transmission line versus frequency f (in GHz) is shown in FIG. 6a. FIG. 6b shows the Q factor as a measure of the quality of the specific transmission line versus frequency f.

As is evident from FIG. 6a, the meander-shaped transmission line (A) at all examined frequency values has the smallest phase shift or electrical length value. In the first embodiment (B), the values of the phase shift increase at each predefined frequency value in the examined frequency domain to approximately double the value, whereas in the case of the second embodiment (C) the phase shift increases almost six-fold. It is evident from the course of curve D for the fourth embodiment that the values of the phase shift at each frequency value increase to about 12 times the value in each case.

Finally, it is evident from FIG. 6b that the meander-shaped transmission line (A) at frequencies above 1 GHz in each case has the lowest value for quality and thereby the highest insertion loss. In comparison, e.g., at f=10 GHz in the case of the first embodiment (B) the value of the Q-factors increases by almost 60%, whereas in the second embodiment (C) it increases to almost six times the value and in the fourth embodiment (D) to approximately three times the value in comparison with the meander-shaped transmission line (A). The insertion loss of the second embodiment (C) or the fourth embodiment (D) therefore declines to approximately ⅙ or ⅓ of the values of the meander-shaped line (A).

The transmission line described previously with reference to the embodiments can be used in the most diverse applications in resonator, filter, matching, impedance transformation, and amplifier circuits, etc.

The transmission line according to the invention is a component of an integrated circuit, which, e.g., is made as a monolithically integrated circuit (e.g., application specific integrated circuit, ASIC, or application specific standard product, ASSP), as a hybrid circuit (thin-or thick-layer technology), or as a multilayer-ceramic circuit arrangement.

Although the present invention was described above with reference to the described embodiments, it is not limited thereto but can be modified in many ways. Thus, for example, the invention is limited neither to the indicated line lengths, widths, or distances, nor to the indicated values of N, the number of crossing, positive feedback, and negative feedback regions cited as an example, or to the number of trace sections contained therein, etc. Instead of the square form of the traces shown in the figures, these can also be made octahedral, round, oval, etc. The invention is also not limited to the indicated number of trace loops lying within each other or the indicated numbers of metallization levels.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated circuit having at least one integrated transmission line for the transmission of a high-frequency differential signal, the integrated circuit comprising:

at least two series-connected line arrangements, each of which has a differential input, a differential output, a first trace connected to a first terminal of the differential input and a first terminal of the differential output, and a second trace connected to a second terminal of the differential input and a second terminal of the differential output, wherein each line arrangement has at least two crossing regions in which the first and the second traces cross, and wherein each line arrangement has at least four positive feedback regions, in which at least one first section of the first trace is placed at a first distance to at least one second section of the second trace in such a way that the magnetic fields, caused by currents flowing in the first and section sections, are mutually amplified in the exterior space surrounding the first and second sections when the high-frequency differential signal is applied at the differential input of the line arrangement.

2. The integrated circuit according to claim 1, wherein the at least one first section and the at least one second section run parallel or substantially parallel to one another.

3. The integrated circuit according to claim 1, wherein the line arrangements are substantially identical.

4. The integrated circuit according to claim 1, wherein each line arrangement is formed so that the first and second sections together have a total length corresponding to a large portion or at least a third of the total length of the first and the second trace of this line arrangement.

5. The integrated circuit according to claim 1, wherein the first distance has a value corresponding to 50% to 200%, preferably 100% of the width of the first trace.

6. The integrated circuit according to claim 1, wherein at least two capacitive elements are provided in the positive feedback regions of each line arrangement between the first trace and the second trace.

7. The integrated circuit according to claim 6, wherein the at least two capacitive elements have at least one capacitor or an MIM capacitor.

8. The integrated circuit according to claim 6, wherein the at least two capacitive elements have at least one element of variable capacitance, a varactor, or a capacitive digital-to-analog converter.

9. The integrated circuit according to claim 1, wherein at least two amplification elements or transistors are placed in the positive feedback regions of each line arrangement between the first trace and the second trace.

10. The integrated circuit according to claim 1, wherein each line arrangement is formed so that overall a large portion, preferably at least ⅓, of the area occupied overall by the line arrangement is occupied by the first or the second trace.

11. The integrated circuit according to claim 1, wherein each line arrangement is formed so that the first trace and the second trace each form at least two loops and the loops of the first trace lie partially within the loops of the second trace and partially surround them.

12. The integrated circuit according to claim 1, wherein each line arrangement is formed so that the currents, flowing in directly adjacent trace sections, when the high-frequency differential signal is applied at the differential input of the line arrangement, do not mutually displace each other substantially in any of the directly adjacent trace sections.

13. The integrated circuit according to claim 1, wherein each line arrangement has negative feedback regions, in each of which a third section of the first or second trace is placed at a greater second distance to a directly adjacent fourth section of the first or second trace so that in the interior space between the third and fourth sections the magnetic fields caused by the currents flowing through the third and fourth sections, when the high-frequency differential signal is applied at the differential input of the line arrangement, are displaced, wherein the second distance is greater than the first distance.

14. The integrated circuit according to claim 13, wherein the third and the fourth sections run parallel to one another.

15. The integrated circuit according to claim 13, wherein each line arrangement is formed so that the third and fourth sections together have a shorter total length than the first and second sections together.

16. The integrated circuit according to claim 13, wherein the second distance has a value corresponding to two to six times or three to five times the value of the width of the first trace.

17. The integrated circuit according to claim 1, wherein the first trace and the second trace are each formed to be substantially symmetric to a point that lies in one of the crossing region.

18. The integrated circuit according to claim 1, wherein the first traces and the second traces are each formed to be substantially symmetric to a level that is perpendicular to the propagation direction of the high-frequency differential signal.

19. The integrated circuit according to claim 1, wherein the integrated circuit has at least two metallization levels.

20. The integrated circuit according to claim 1, wherein currents flow codirectionally or substantially codirectionally through the at least one first section and the at least one second section, when the high-frequency differential signal is applied at differential input of the line arrangement.

21. The integrated circuit according to claim 1, wherein the at least one first section and the at least one second section run at an angle of a maximum 45 degrees to one another.

22. The integrated circuit according to claim 1, wherein the at least one first section and the at least one second section run at an angle of a maximum 30 degrees to one another.

* * * * *